United States Patent
Okada et al.

(10) Patent No.: US 7,044,659 B2
(45) Date of Patent: May 16, 2006

(54) OPTICAL COMMUNICATIONS MODULE AND METHOD FOR PRODUCING THE MODULE

(75) Inventors: Takeshi Okada, Osaka (JP); Hiromi Nakanishi, Osaka (JP); Akira Yamaguchi, Osaka (JP); Yoshiki Kuhara, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/061,560

(22) Filed: Feb. 18, 2005

(65) Prior Publication Data

US 2005/0156198 A1    Jul. 21, 2005

Related U.S. Application Data

(63) Continuation of application No. 10/436,634, filed on May 13, 2003, now Pat. No. 6,877,914.

(30) Foreign Application Priority Data

Jun. 18, 2002    (JP) .............................. 2002-176548

(51) Int. Cl.
    *G02B 6/36* (2006.01)
(52) U.S. Cl. .............................. 385/92; 385/49; 385/88; 430/945; 428/64.1; 257/88
(58) Field of Classification Search ................. 385/14, 385/49, 88–94; 430/945; 428/64.1; 257/88
    See application file for complete search history.

(56) References Cited

U.S. PATENT DOCUMENTS 6,614,964 B1    9/2003    Nakanishi et al.
6,655,856 B1    12/2003   Nakanishi et al.

6,744,074 B1    6/2004    Horie et al.

(Continued)

FOREIGN PATENT DOCUMENTS

JP    11068705    3/1999

(Continued)

OTHER PUBLICATIONS

R. Takahashi et al. (1999) "Packaging of optical semiconductor chips for SFF (small form factor) optical transreceiver", Electronics Society Conference of IEICE, p. 133, No. C-3-28 (Prior Art cited in the Specification) and its English translation.

(Continued)

*Primary Examiner*—Phan Palmer
(74) *Attorney, Agent, or Firm*—Fish & Richardson P.C.

(57) ABSTRACT

An optical communications module in which electrical crosstalk is reduced. The term "optical communications module" represents a surface-mounting-type optical tranceiver, transmitter, or receiver module. The optical communications module has a following structure. (a) An Si substrate carries at least one signal-transmitting section comprising an LD, at least one signal-receiving section comprising a PD, or both together with other components. (b) An insulating substrate is bonded to the back face of the Si substrate. (c) A separating groove separates the Si substrate along the or each boundary line between the sections in order to prevent an AC current flowing through the Si substrate. To attain this object, the separating groove is provided from the top surface of the Si substrate to some midpoint of the insulating substrate. This structure reduces the electrical crosstalk between the signal-transmitting section and the signal-receiving section, between the signal-transmitting sections, and between the signal-receiving sections.

8 Claims, 7 Drawing Sheets

Example 1

U.S. PATENT DOCUMENTS 6,877,914 B1 * 4/2005 Okada et al. .................. 385/92

FOREIGN PATENT DOCUMENTS

| | | |
|---|---|---|
| JP | 11202140 | 7/1999 |
| JP | 2002170984 | 6/2002 |

OTHER PUBLICATIONS

S. Ishii et al. (2000) "Crosstalk analysis of MT-RJ optical assembly", Electronics Society Conference of IEICE, p. 352, No. SC-3-7 and its English translation.

* cited by examiner

Example 1

Example 1

Example 4

US 7,044,659 B2

OPTICAL COMMUNICATIONS MODULE AND METHOD FOR PRODUCING THE MODULE

CROSS-REFERENCE TO RELATED APPLICATION(S)

This application is a continuation of U.S. Ser. No. 10/436,634, filed May 13, 2003 now U.S. Pat. No. 6,877,914, which in turn claims the benefit of Japanese Application No. 2002-176548, filed Jun. 18, 2002.

BACKGROUND OF THE INVENTION

1. Field of the Invention

The present invention relates to an optical communications module for use in optical communications which is provided with at least one laser diode, at least one photodiode, or both for transmitting and receiving optical signals, and particularly to an optical communications module in which electrical crosstalk between the signal-transmitting section and the signal-receiving section, between the signal-transmitting sections, and between the signal-receiving sections is reduced. The present invention also relates to a method for producing the optical communications module.

2. Description of the Background Art

In the optical communications system using light for transmitting information, the optical communications modules described below are known for transmitting and receiving optical signals propagating over an optical transmission line such as an optical fiber transmission line.

(a) Ryuta Takahashi et al. have proposed the following optical module in the report entitled "Packaging of optical semiconductor chips for SFF (small form factor) optical transceiver" included in the proceedings of the 1999 Electronics Society Conference of IEICE (The Institute of Electronics, Information and Communication Engineers of Japan) (page 133, number C-3-28). The optical module incorporates an Si substrate provided with two V-shaped grooves and metallized patterns (electrode patterns). A laser diode (hereinafter referred to as an LD) for signal transmission and a photodiode (hereinafter referred to as a PD) for signal reception are placed on the metallized patterns. Optical fibers are securely held in the V-shaped grooves to be butt-connected with the LD and PD for enabling the interchange of the signal light.

The module is illustrated in FIGS. 9 and 10. FIG. 9 is a plan view and FIG. 10 a longitudinal cross section. An insulating layer 3 ($SiO_2$) is formed on the rear half of a rectangular Si substrate 2. An LD 4 for signal transmission and a PD 5 for signal reception are mounted on the insulating layer 3. Two parallel V-shaped grooves 7 and 8 are formed on the front half 6 of the Si substrate 2. The V-shaped grooves are formed with high precision by the anisotropic etching of an Si single crystal. Optical fibers 9 and 10 are fitted in the V-shaped grooves 7 and 8 and fixed there. The end of the optical fiber 9 faces the LD 4 and that of the optical fiber 10 faces the PD 5. As shown in FIG. 10, a light-emitting layer 27 of the LD 4 is positioned at the same level as that of the center of the optical fiber 9. Light emitted from the side face of the LD 4 propagates over the optical fiber 9 to the outside. Conversely, light from the outside optical fiber propagates over the optical fiber 10 to reach the side face of the PD 5. Therefore, the PD 5 must be a side-illuminated type. Front- and rear-illuminated types cannot be used.

The LD 4 and PD 5 are placed with left-right symmetry with respect to the centerline of the Si substrate 2. Consequently, the optical fibers are parallel to each other, and the LD 4 and PD 5 are parallel to each other. This configuration can reduce the space needed. Because the LD 4 and PD 5 are mounted on the same Si substrate 2 in parallel, the module can reduce the parts prices, mounting cost, and size.

The Si substrate 2 has a rectangular shape with a length of 5 mm and a width of 2.5 mm. Actually, the optical fibers, LD 4, PD 5, and other components are covered with a transparent resin. Furthermore, the entire unit is encapsulated with a shape-holding resin to form a module of a plastic-molded package type.

(b) The published Japanese patent application Tokukaihei 11-68705 entitled "bidirectional optical WDM (wavelength division multiplexing) tranceiver module" has proposed a tranceiver module. In the tranceiver module, an $SiO_2$ insulating layer is formed on an Si substrate. A Y-shaped optical waveguide made of $GeO_2$-doped $SiO_2$ enclosed by $SiO_2$ is formed on the insulating layer. A PD is placed at the position corresponding to the bottom end of the letter Y. An optical fiber is connected to the position corresponding to the left upper end of the letter Y. An LD is placed at the position corresponding to the right upper end of the letter Y. A WDM filter that selectively reflects 1.3-μm light and selectively transmits 1.55-μm light is placed at the junction point of the letter Y. The 1.3-μm light for signal transmission emitted from the LD propagates over the optical waveguide, is reflected by the filter, enters the optical fiber, and transmits to the outside.

Conversely, light having propagated over a optical fiber from the outside enters the optical waveguide, passes through the filter, and enters the PD to give signals. The PD, also, is a side-illuminated type. Front- and rear-illuminated types cannot be used. In this tranceiver module, the LD and PD are placed with front and rear symmetry, not with left-right symmetry.

Both tranceiver modules explained in (a) and (b) above have a structure in which an LD and a PD are mounted on an Si substrate, and they are connected to the outside optical fiber through an optical transmission medium such as an optical waveguide or fiber. The propagation direction of light, the chip faces, and the substrate surface are parallel to one another. Consequently, light propagates two-dimensionally without requiring a wide space. As a result, a tiny, low-cost optical tranceiver module can be produced.

However, the tiny, low-cost optical tranceiver module newly makes a problem of electrical crosstalk caused by the intrusion of noise from the signal-transmitting section to the signal-receiving section. There are two causes for the crosstalk. FIG. 11 is a lateral cross section at a plane including the LD and PD in the optical tranceiver module shown in FIGS. 9 and 10. The causes of the crosstalk are explained as follows by using FIG. 11.

(1) The insulating layer 3 ($SiO_2$ layer) sandwiched between the metallized patterns 20 and 24 and the Si substrate 2 is a dielectric material and has capacitances C2 and C3.

(2) The Si substrate 2 is a semiconductor substrate having finite resistances R4, R5, R6, and R7.

Therefore, the LD 4 and the PD 5 are connected to each other through an AC circuit composed of the resistances R4, R5, R6, and R7 in the Si substrate 2 and the equivalent capacitances C2 and C3 in the insulating layer 3. Because the insulating layer 3 is thin, the capacitances C2 and C3 are high. Because the frequency is high, the reactances $1/j\omega C2$ and $1/j\omega C3$ are low. The Si substrate 2 is made of an n- or p-type Si single crystal having low resistivity for a semiconductor. Consequently, the value of R4+R5+R6+R7 is considerably low. As a result, the total impedance $Z=1/j\omega C2+1/j\omega C3+R4+R5+R6+R7$ is considerably low. This low impedance allows intense electrical signals to be fed to the LD to leak into the PD and mix with received signals. Thus, electrical crosstalk is caused between the LD and PD through the Si substrate.

(c) Sonomi Ishii et al. have proposed an idea to reduce the crosstalk between the signal-transmitting section and the signal-receiving section in the report entitled "Crosstalk analysis of MT-RJ optical subassembly" included in the proceedings of the 2000 Electronics Society Conference of IEICE (page 352, number SC-3-7). The idea employs a shield plate inserted into a groove provided at a location between the signal-transmitting section and the signal-receiving section on an Si substrate. The groove has a depth less than the thickness of the Si substrate. The distance between the optical axes of the two sections is 750 μm. It can be said that the shield plate is provided to prevent crosstalk caused by electromagnetic waves rather than by electric current. To block electromagnetic waves intruding from the LD to the PD, the shield plate is substantially high from the surface of the Si substrate. However, because the impedance $Z=1/j\omega C2+1/j\omega C3+R4+R5+R6+R7$ is low, the electrical crosstalk caused by an AC current flowing through the Si substrate remains high.

(d) The published Japanese patent application Tokukai 2002-170984 (filed as Tokugan 2000-367925) entitled "Optical communications unit" has proposed a structure to reduce electromagnetic crosstalk. In the proposed structure, a series of through holes are provided somewhere between the LD and PD on the Si substrate. A metallic shield plate having a comb-shaped foot is inserted into the holes. The foot is soldered to a metallic base plate attached to the back face of the Si substrate. The LD and PD are isolated from each other with a metallic box incorporating the metallic shield plate as a separator. The structure is intended to completely suppress crosstalk caused by electromagnetic waves. Electric signals for the LD emit substantially intense electromagnetic waves because they are composed of high-speed pulses. The electromagnetic coupling between the LD and PD placed in proximity to each other allows the electromagnetic waves to intrude into the PD as noises. To prevent the intrusion, the prior art (d) has devised a structure in which the electromagnetic waves are contained in the metallic box that separately encases the LD and PD sections.

There are three types of crosstalk between the signal-transmitting section (LD section) and the signal-receiving section (PD section): optical crosstalk, electromagnetic crosstalk, and electrical crosstalk. Because the signals have high frequency, electromagnetic crosstalk is noticeable. However, attention must be paid to the presence of electrical crosstalk. In the situation under consideration, the Si substrate 2 is a good conductor rather than a semiconductor. The insulating layer 3 is thin and allows AC current to flow. As a result, electrical crosstalk becomes significant. The prior arts (a) and (b) described above have no effective measure against the problem of the crosstalk between the signal-transmitting and -receiving sections. The prior arts (c) and (d) merely describe measures against electromagnetic crosstalk. It cannot be said that sufficient attention is paid to the electrical crosstalk in the prior arts cited above.

The fact that the Si substrate is a good conductor in this case may have been neglected in the above-described prior arts. If the substrate is produced by using an insulating material such as a ceramic material, the problem of the electrical crosstalk may be solved. However, a ceramic substrate is devoid of the advantages the Si substrate innately has. The Si substrate is advantageous in that photolithographic techniques form with extremely high precision the V-shaped grooves, the positioning marks for the LD and PD, and the various patterns, and substrates can be mass-produced using a large wafer. Now, Si single crystals are produced by the most advanced single-crystal production technology. Large Si wafers (300 mm in diameter) are available at low prices. The production technology of Si wafers has been highly sophisticated to such an extent that the formation of the V-shaped grooves and marking can be easily performed with high precision. The Si substrate has attractive features that cannot be obtained with a ceramic substrate.

SUMMARY OF THE INVENTION

As described above, it is urgently required to eliminate the electrical crosstalk through a substrate without losing the advantageous features that a semiconductor substrate, such as an Si substrate, innately has. An object of the present invention is to offer a structure that can reduce the electrical crosstalk in an optical communications module having at least one signal-transmitting section and at least one signal-receiving section, a plurality of signal-transmitting sections, or a plurality of signal-receiving sections on the Si substrate.

According to the present invention, the foregoing object is attained by an optical communications module that has the following structure:

(a) An Si substrate carries a pair of a signal-transmitting section and a signal-receiving section, a plurality of signal-transmitting sections, a plurality of signal-receiving sections, or a plurality of pairs of a signal-transmitting section and a signal-receiving section.

(b) An insulating substrate is bonded to the back face of the Si substrate.

(c) A separating groove is provided to separate the Si substrate along the or each boundary line between the foregoing sections. For this purpose, the separating groove is provided from the top surface of the Si substrate to some midpoint of the insulating substrate.

The optical communications module may further have at least one optical waveguide formed on the Si substrate. In place of this structure, the optical communications module may further have the following structure:

(a) At least one V-shaped groove is formed on the Si substrate.

(b) An optical fiber is fixed in the or each V-shaped groove.

The optical communications module may have a structure in which the or each signal-transmitting section comprises a laser diode.

The optical communications module may have a structure in which the or each signal-receiving section comprises a photodiode.

Because, the foregoing separating groove separates the Si substrate, the total summation of the above-described series resistances formed through the Si substrate becomes nearly infinity, as described below. When the series resistance in the separating groove is denoted by R8, the amount of R8 is nearly infinity and can be expressed as $R8=\infty$. Consequently, the total summation of the resistances is expressed as $R4+R5+R8+R6+R7=\infty$. On the other hand, the separating groove also produces an additional capacitance C9. Therefore, the total impedance is expressed as $Z=1/j\omega C2+1/j\omega C3+R4+R5+1/j\omega C9+R6+R7$. However, when the width W of the separating groove is widened, the capacitance C9 can be reduced considerably. As a result, the total impedance can be increased.

According to the present invention, the separating groove separates the Si substrate so as to isolate the signal-transmitting section and the signal-receiving section from each other. When the Si substrate carries a plurality of signal-transmitting sections, the separating groove isolates the signal-transmitting sections from each other. When the Si substrate carries a plurality of signal-receiving sections, the separating groove isolates the signal-receiving sections from each other.

When the Si substrate alone is used, the separating groove take the Si substrate to pieces. To maintain the integral structure of the Si substrate, an insulting substrate is bonded to the back face of the Si substrate before the separating groove is formed. Even when the separating groove penetrating into the insulating substrate to a certain extent is formed from the top surface of the Si substrate, the insulating substrate can maintain the original position of the separated Si substrate.

If the Si substrate is severed without using the insulating substrate, the optical fiber, LD, and PD cannot be mounted with high precision. If high precision cannot be attained, there is no point in using the single-crystalline Si substrate. According to the present invention, after the insulating substrate is bonded to the back face of the Si substrate, the optical fiber, LD, and PD are mounted on the Si substrate with high precision. Subsequently, the separating groove penetrating into the insulating substrate to a certain extent is formed from the top surface of the Si substrate.

When the thickness of the Si substrate is denoted by s, the depth of the separating groove by g, and the thickness of the insulating substrate by q, the depth of the separating groove g has the following relationship:

$$s<g<s+q \tag{1}.$$

Although the Si substrate is electrically separated completely by the separating groove (R8=∞), the separated portions are mechanically connected by the insulating substrate.

The Si substrate used for a surface-mounting-type optical communications module usually has a thickness of 0.5 to 1.5 mm or so. It is substantially thick, because it alone must support optical devices and optical fibers. The Si substrate for the present invention, also, may have a thickness of 0.5 to 1.5 mm. According to the present invention, however, the thickness may be reduced, because the Si substrate is reinforced by the insulating substrate. For example, the thickness may be reduced to the range of 0.06 to 0.5 mm.

As described above, in the present invention, an insulating substrate is bonded to the back face of the Si substrate so that the Si substrate can be separated with a separating groove. Without the insulating substrate, the Si substrate goes to pieces by the separating groove. The insulating substrate is bonded to the Si substrate before the Si substrate is separated. If the Si substrate is separated before the bonding of the insulating substrate and is mounted onto the insulating substrate in such a manner as to fit together the pieces of a jigsaw puzzle, the mounting cannot be performed with high precision. If high precision cannot be attained, there is no point in using the Si substrate. The types of insulating substrates include a ceramic substrate and a plastic substrate.

According to the present invention, various components such as an LD, PD, optical fiber, and optical waveguide are mounted on the Si substrate reinforced by the insulating substrate. Before or after the mounting of the foregoing components, the Si substrate is separated to isolate the or each signal-transmitting section and the or each signal-receiving section from the neighboring section or sections. This structure can significantly suppress the crosstalk caused by a current flowing through the Si substrate. Although, the Si substrate is separated to electrically isolate the foregoing sections from each other, the separated portions are mechanically connected by the insulating substrate at the time the components are mounted. Therefore, high-precision mounting is possible by exploiting the advantageous features of the Si substrate.

The communications module of the present invention can considerably reduce the following electrical crosstalks:
  (a) with a single-channel tranceiver, the crosstalk between the signal-transmitting section and the signal-receiving section;
  (b) with a multiple-channel transmitter or receiver, the crosstalk between the channels; and
  (c) with a multiple-channel tranceiver, the crosstalk not only between the signal-transmitting section and the signal-receiving section in each channel but also between the channels.

As a result, a high-performance and tiny optical communications module can be produced. Additional production steps are the bonding of the insulating substrate to the Si substrate and the separation of the Si substrate. Therefore, the optical communications module is suitable for mass production at low cost.

In accordance with an aspect of the present invention, a method for producing an optical communications module comprises the following steps:
  (a) An Si wafer is produced on which a multitude of segments to be used as substrate chips for optical communications are provided. Each of the segments is provided with:
    (a2) at least one V-shaped groove or at least one optical waveguide, and
    (a2) a plurality of metallized patterns formed by evaporation, etching, or printing.
  (b) The Si wafer is cut into individual chips to obtain Si substrates for optical communications.
  (c) A pair of a signal-transmitting section and a signal-receiving section, a plurality of signal-transmitting sections, a plurality of signal-receiving sections, or a plurality of pairs of a signal-transmitting section and a signal-receiving section are mounted onto one of the Si substrates.
  (d) An insulating substrate is bonded to the back face of the Si substrate.
  (e) A separating groove is provided to separates the Si substrate along the or each boundary line between the foregoing sections in order to prevent the electrical crosstalk through the Si substrate. In this case, the separating groove is provided from the top surface of the Si substrate to some midpoint of the insulating substrate.

In accordance with another aspect of the present invention, a method for producing an optical communications module comprises the following steps:
  (a) An insulating substrate is bonded to the back face of an Si wafer.

(b) A multitude of segments to be used as chips for optical communications are provided on the Si wafer. Each of the segments is provided with:
  (b1) at least one V-shaped groove or at least one optical waveguide;
  (b2) a plurality of metallized patterns formed by evaporation, etching, or printing;
  (b3) a pair of a signal-transmitting section and a signal-receiving section, a plurality of signal-transmitting sections, a plurality of signal-receiving sections, or a plurality of pairs of a signal-transmitting section and a signal-receiving section; and
  (b4) a separating groove that separates the Si wafer along the or each boundary line between the foregoing sections in order to prevent electrical crosstalk.
In this case, the separating groove is provided from the top surface of the Si wafer to some midpoint of the insulating substrate.
(c) The Si wafer is cut into individual chips.

In accordance with yet another aspect of the present invention, a method for producing an optical communications module comprises the following steps:
(a) An Si wafer is produced on which a multitude of segments to be used as substrate chips for optical communications are provided. Each of the segments is provided with:
  (a1) at least one V-shaped groove or at least one optical waveguide;
  (a2) a plurality of metallized patterns formed by evaporation, etching, or printing; and
  (a3) a plurality of spaces each of which is to be used for mounting a signal-transmitting section or a signal-receiving section.
(b) The Si wafer is cut into individual chips to obtain Si substrates for optical communications.
(c) An insulating substrate is bonded to the back face of one of the Si substrates.
(d) A separating groove is provided that separates the Si substrate along the or each boundary line between the spaces in order to prevent the electrical crosstalk through the Si substrate. In this case, the separating groove is provided from the top surface of the Si substrate to some midpoint of the insulting substrate.
(e) A pair of a signal-transmitting section and a signal-receiving section, a plurality of signal-transmitting sections, a plurality of signal-receiving sections, or a plurality of pairs of a signal-transmitting section and a signal-receiving section are mounted in the spaces on the Si substrate.

In accordance with yet another aspect of the present invention, a method for producing an optical communications module comprises the following steps:
(a) An insulating substrate is bonded to the back face of an Si wafer.
(b) A multitude of segments to be used as chips for optical communications are provided on the Si wafer. Each of the segments is provided with:
  (b1) at least one V-shaped groove or at least one optical waveguide;
  (b2) a plurality of metallized patterns formed by evaporation, etching, or printing;
  (b3) a plurality of spaces each of which is to be used for mounting a signal-transmitting section or a signal-receiving section; and
  (b4) a separating groove that separates the Si wafer along the boundary line between the spaces in order to prevent electrical crosstalk.
In this case, the separating groove is provided from the top surface of the Si wafer to some midpoint of the insulating substrate.
(c) A pair of a signal-transmitting section and a signal-receiving section, a plurality of signal-transmitting sections, a plurality of signal-receiving sections or a plurality of pairs of a signal-transmitting section and a signal-receiving section are mounted in the spaces of each of the segments.
(d) The Si wafer is cut into individual chips.

DETAILED DESCRIPTION OF THE INVENTION

Figure 1:
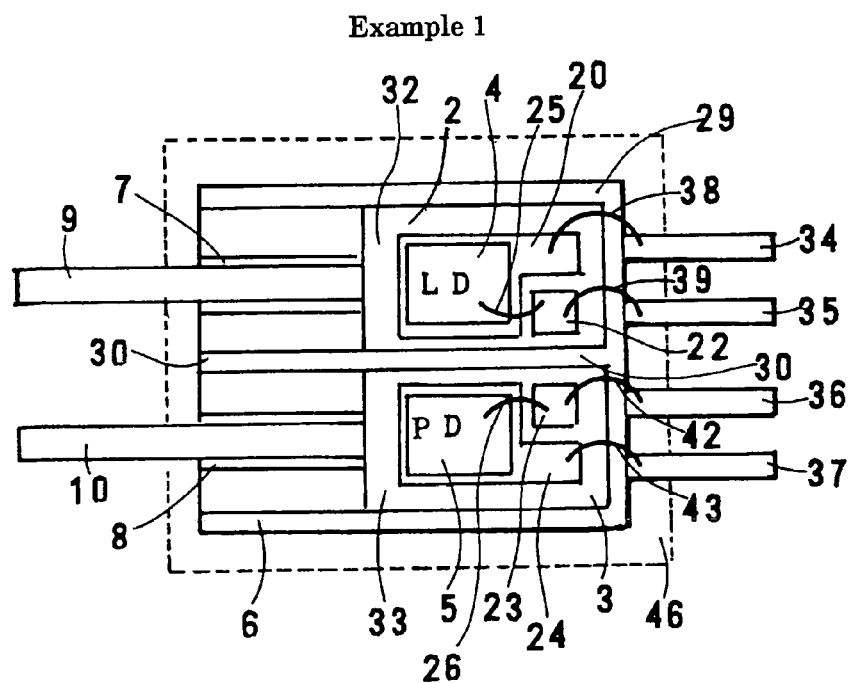
FIG. 1 is a plan view showing the optical communications module of Example 1 of the present invention.

Desirable embodiments of the optical communications module of the present invention are explained below in detail by showing the principal components and by referring to the accompanying drawings. To avoid duplicated explanations, the same signs are allocated to the same members throughout the drawings. The ratio of the dimensions in the drawings do not necessarily coincide with the explanation.

[A. Si Substrate]

A single-crystalline Si substrate is used to effectively increase the mounting accuracy. For this purpose, a (001) single-crystalline Si substrate is used because it is advantageous in accurately forming the V-shaped grooves in terms of the angle and breadth by anisotropic etching. The mounting positions of the LD and PD are indicated by marking in advance. The thickness may be the same as or thinner than that of the Si substrate used for ordinary surface mounting.

[B. Optical Path]

An optical path on the Si substrate may be formed either by an optical fiber or by an optical waveguide. An optical fiber is fitted in a V-shaped groove formed on the Si substrate and is fixed there.

[C. Insulating Substrate]

The Si substrate is supported by an insulating substrate. Without the insulating substrate, the below-mentioned separating groove cannot be formed. The size of the insulating substrate may be the same as or slightly larger than that of the Si substrate. A ceramic or plastic substrate is used as the insulating substrate. The insulating substrate may be bonded either to the back face of an Si wafer before cutting into chips or to the back face of the Si substrate.

[D. Separating Groove]

A separating groove is formed to provide electrical isolation between a signal-transmitting section and a signal-receiving section, between signal-transmitting sections, and between signal-receiving sections. The separating groove has a depth exceeding the thickness of the Si substrate and penetrating into the insulating substrate to a certain extent. When the Si substrate carries one signal-transmitting section and one signal-receiving section, one separating groove is needed. When the Si substrate carries more than two optical devices, multiple separating grooves are needed.

[E. Combination of a Signal-transmitting Section and a Signal-receiving Section]

When the Si substrate carries one signal-transmitting section and one signal-receiving section, one separating groove is provided between the two sections. When the two sections are placed with left-right symmetry, the separating groove is provided longitudinally along the bisector. When one section is placed in the front and the other in the rear, the separating groove is provided laterally between the two sections.

[F. Combination of a Plurality of Signal-transmitting Sections]

When the Si substrate carries a plurality of signal-transmitting sections, a separating groove or separating grooves are provided along the individual boundary lines.

[G. Combination of a Plurality of Signal-receiving Sections]

When the Si substrate carries a plurality of signal-receiving sections, a separating groove or separating grooves are provided along the individual boundary lines.

[H. Combination of a Plurality of Signal-transmitting Sections and Signal-receiving Sections]

When the Si substrate carries a plurality of signal-transmitting sections and signal-receiving sections, separating grooves are provided along the individual boundary lines.

EXAMPLE 1

Figure 2:
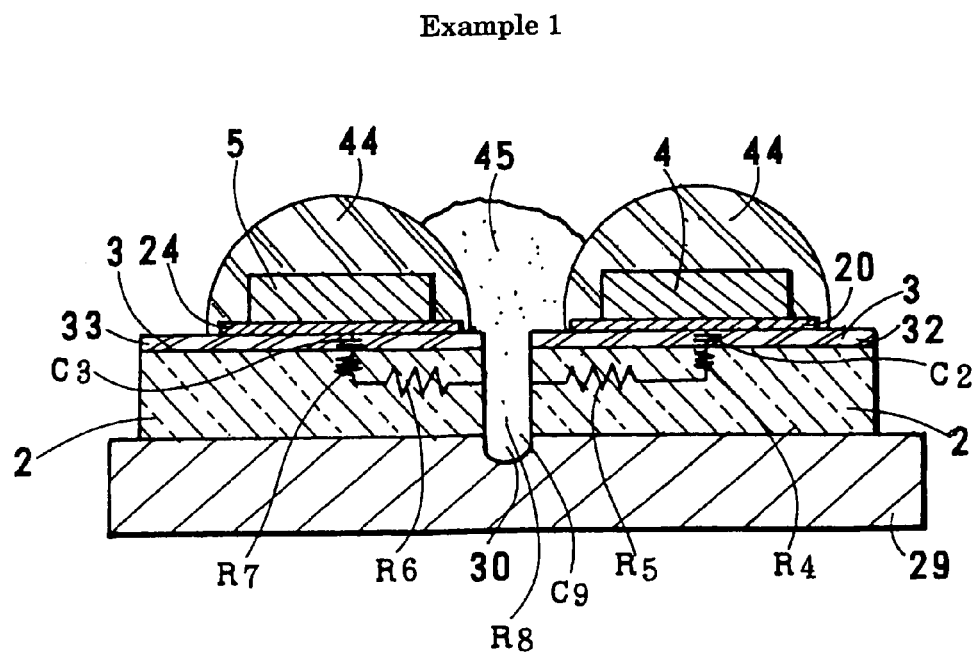
FIG. 2 is a lateral cross section showing the optical communications module of Example 1 of the present invention.

1. Two Optical Fibers, One Signal-transmitting Section, and One Signal-receiving Section: FIGS. 1 and 2

FIGS. 1 and 2 show the optical communications module of Example 1. The Si substrate 2 is divided into two sections. An insulating substrate 29 is bonded to the back face of the rectangular Si substrate 2. Insulating layers 3 ($SiO_2$ layer) are formed on the rear half of the Si substrate 2 to insulate the optical devices and wiring from the substrate.

The insulating layer 3 may be an $SiO_2$ layer obtained by thermally oxidizing the Si substrate. Metallized patterns 20, 22, 23, and 24 are formed on the insulating layer 3. An LD 4 is bonded onto the metallized pattern 20. The electrode on the LD 4 is connected to the metallized pattern 22 with a wire 25. A PD 5 is bonded onto the metallized pattern 24. The PD 5 is a side-illuminated type, which is also called a waveguide type. Light incident at the side face of the PD 5 propagates along the waveguide and reaches the light-absorbing layer to generate photoelectric current. The electrode on the PD 5 is connected to the metallized pattern 23 with a wire 26.

Parallel lead pins 34 to 37 protrude from the rear end of the insulating substrate 29. They function as interfaces with the outside circuits. The metallized pattern 20 is connected to the lead pin 34 with a wire 38, and the metallized pattern 22 to the lead pin 35 with a wire 39. These connections supply driving currents to the LD 4. Similarly, the metallized pattern 23 is connected to the lead pin 36 with a wire 42, and the metallized pattern 24 to the lead pin 37 with a wire 43. These connections draw out photoelectric currents from the PD 5.

Two parallel V-shaped grooves 7 and 8 are formed on the front half 6 of the Si substrate 2. Optical fibers 9 and 10 are fitted in the V-shaped grooves 7 and 8 and fixed there with an adhesive. After this process, a separating groove 30 is formed to separate the Si substrate 2 along the longitudinal bisector between the signal-transmitting section 32 and the signal-receiving section 33. Notwithstanding the above description, the separating groove 30 may be formed before the mounting of the signal-transmitting section 32 and the signal-receiving section 33.

As shown in FIG. 2, which is a lateral cross section, the Si substrate 2 is separated at the center. The separating groove 30 penetrates into the insulating substrate 29 to a certain extent. The presence of the insulating substrate 29 can maintain the solidity not only of the Si substrate 2 but also of the LD, PD, and optical fibers on the Si substrate. The presence of the separating groove 30 can electrically isolate the signal-transmitting section 32 and the signal-receiving section 33 from each other. A transparent resin 44 fills the space between the optical fiber 9 and the LD 4. Another transparent resin 44 fills the space between the optical fiber 10 and the PD 5. The transparent resins 44 are provided to reduce the reflection loss at the end faces of the optical fibers. Furthermore, a black resin 45 fills the separating groove 30. The black resin 45 prevents the scattered light of the LD 4 at the signal-transmitting section from entering the PD 5 at the signal-receiving section. In other words, the black resin 45 prevents optical crosstalk. In addition, the entire unit is molded with a stiff encapsulating resin 46 such as epoxy resin to complete the production of the resin package-type optical tranceiver module.

Figure 9:
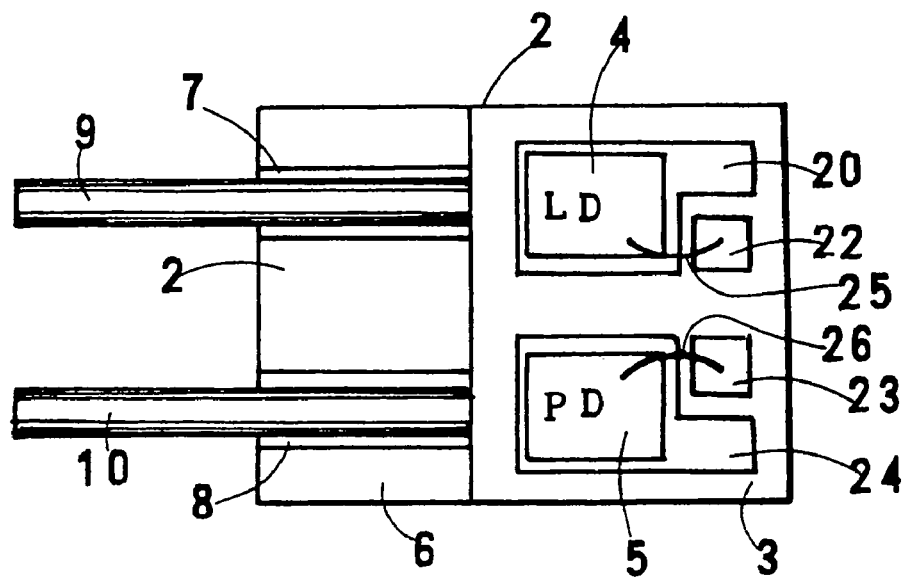
FIG. 9 is a plan view of an optical tranceiver module of a prior art in which a signal-transmitting section (LD) and a signal-receiving section (PD) are placed with left-right symmetry on an Si substrate having two parallel V-shaped grooves, and optical fibers are fitted in the V-shaped grooves.
Figure 10:
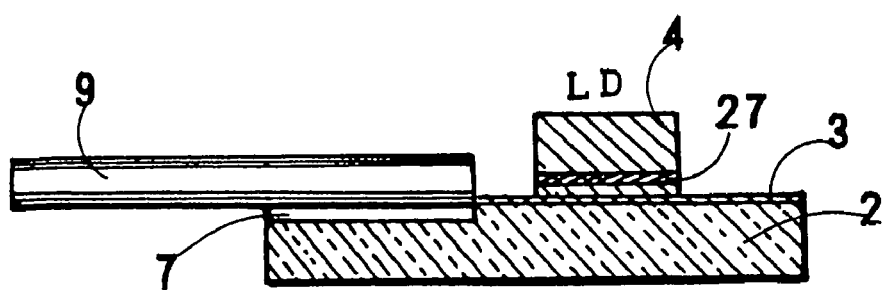
FIG. 10 is a longitudinal cross section of the optical tranceiver module shown in FIG. 9.
Figure 11:
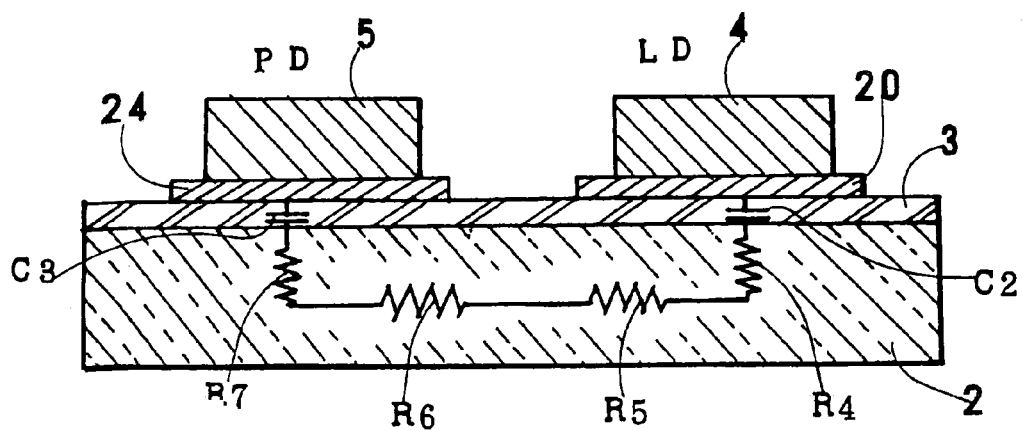
FIG. 11 is a lateral cross section at a plane including the LD and PD in the optical tranceiver module shown in FIG. 9.

As with the prior art explained by referring to FIGS. 9 to 11, resistances R4 and R5 actually exist at the signal-transmitting section 32, and resistances R6 and R7 actually exist at the signal-receiving section 33, because the Si substrate 2 is electrically conductive to a certain degree. Capacitances C2 and C3, also, exist in the insulating layer 3.

As distinct from the foregoing prior art, the present invention provides the separating groove 30, which isolates the signal-transmitting section 32 and the signal-receiving section 33 from each other on the Si substrate 2. The separating groove 30 produces an additional resistance R8. The amount of R8 is nearly infinity and can be expressed as R8=∞. Consequently, the total summation of the resistances is infinity. On the other hand, the separating groove 30 also produces an additional capacitance C9. Therefore, the total impedance is expressed as $Z=1/j\omega C2+1/j\omega C3+R4+R5+1/j\omega C9+R6+R7$. However, the capacitance C9 is extremely small, making the total impedance extremely high. As a result, the electrical crosstalk between the signal-transmitting section and the signal-receiving section becomes extremely small.

The two parallel optical fibers connected to the LD and PD in Example 1 can be replaced with two parallel optical waveguides formed on the Si substrate 2. The optical waveguides are formed at the places provided for the V-shaped grooves 7 and 8 in FIG. 1. The end faces of the two optical fibers from the outside are bonded to the side face of the Si substrate 2. Because the structure is similar to that of Example 1, no further explanation is needed. In this case also, the separating groove 30 is provided longitudinally to electrically isolate the signal-transmitting section and the signal-receiving section from each other so that the electrical crosstalk can be reduced.

EXAMPLE 2

Figure 3:
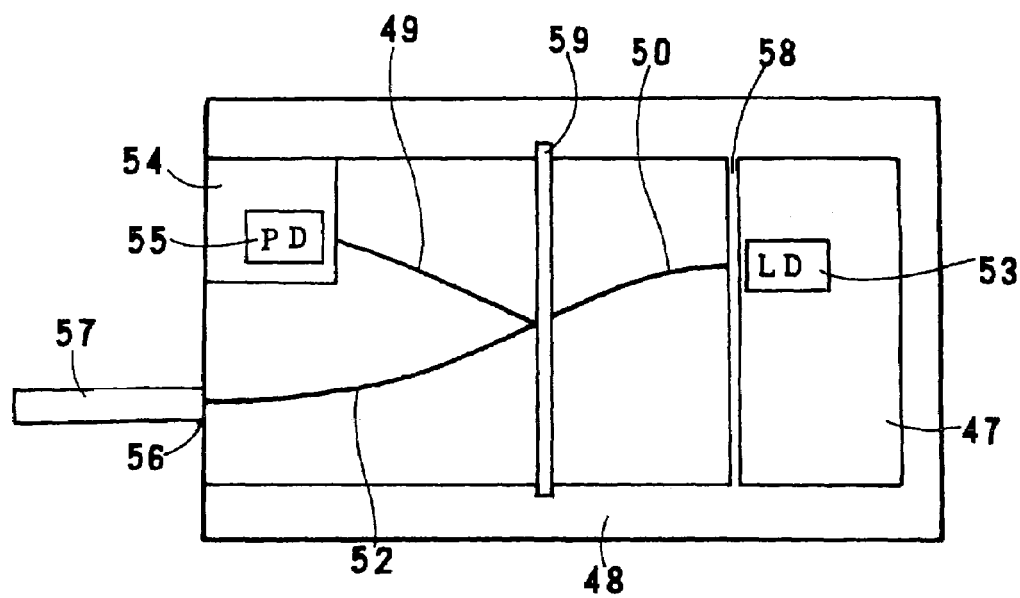
FIG. 3 is a plan view showing the optical communications module of Example 2 of the present invention.
Figure 4:
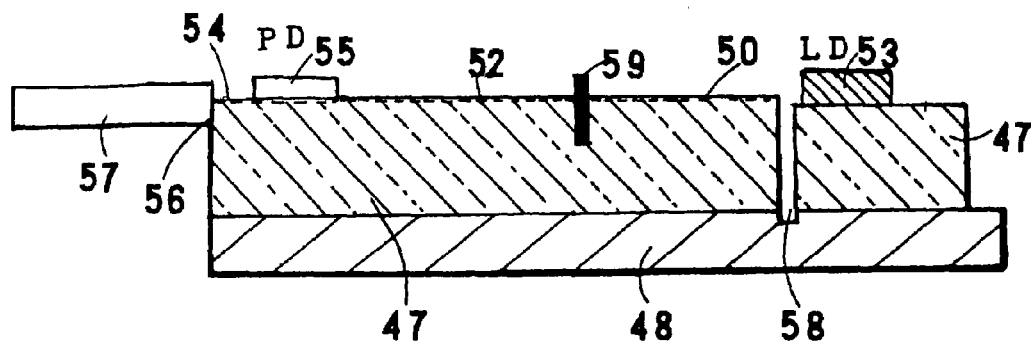
FIG. 4 is a longitudinal cross section showing the optical communications module of Example 2 of the present invention.

2. Y-branched Optical Waveguide, One Signal-transmitting Section, and One Signal-receiving Section: FIGS. 3 and 4

FIGS. 3 and 4 show the optical communications module of Example 2. In this example, the signal-transmitting section and the signal-receiving section are placed in a front and rear configuration on the Si substrate, not in a left-right configuration. An insulating substrate 48 is bonded to the back face of the rectangular Si substrate 47. A wave-guiding layer (SiO$_2$ layer) is formed on the front half and central region of the Si substrate 47. Optical waveguides 49, 50, and 52 are formed in the shape of the curved letter Y in the wave-guiding layer.

The optical waveguides may be silica glass optical waveguides made of GeO$_2$-doped SiO$_2$ enclosed by SiO$_2$ or organic optical waveguides made of polyimide fluoride. The rear region of the Si substrate 47 forms a step slightly lower than the neighboring region. An LD 53 is mounted on the step at the place where the LD 53 faces the end of the optical waveguide 50. A front region 54, also, forms a step slightly lower than the neighboring region. A PD 55 is mounted on the step at the place where the PD 55 faces the end of the optical waveguide 49.

A WDM filter 59 is embedded at the junction point of the optical waveguides 49, 50, and 52. An optical fiber 57 is bonded to the end face 56 of the optical waveguide 52. Incoming light (1.55 μm) from the optical fiber 57 propagates along the optical waveguide 52, is selectively reflected at the WDM filter 59, enters the optical waveguide 49, and enters the PD 55 to generate photoelectric current. Outgoing light (1.3 μm) emitted from the LD 53 enters the optical waveguide 50, passes through the WDM filter 59, propagates along the optical waveguide 52, and enters the optical fiber 57 to propagate to the outside.

As explained above, when the LD 53 and the PD 55 are placed in a front and rear configuration, a separating groove 58 is provided between the LD and PD. Although the separating groove 58 separates the Si substrate 47 completely, it penetrates into the insulating substrate 48 only slightly, leaving almost entire thickness of the insulating substrate 48 intact. Therefore, the insulating substrate 48 can maintain the solidity of the entire unit as an integrated body. The separating groove 58 is advantageous because it reduces the electrical crosstalk between the signal-transmitting section and signal-receiving section.

[3. Module Having Only a Plurality of Signal-transmitting Sections]

The present invention can also be applied to a complex transmitter module having signal-transmitting sections LD1, LD2, . . . , and LDm on the Si substrate. An insulating substrate is bonded to the back face of the Si substrate, and at least one separating groove is provided on the Si substrate along the individual boundary lines of the signal-transmitting sections LD1, LD2, . . . , and LDm. The separating groove or grooves can reduce the electrical crosstalk between the signal-transmitting sections.

[4. Module Having Only a Plurality of Signal-receiving Sections]

The present invention can also be applied to a complex receiver module having signal-receiving sections PD1, PD2, . . . , and PDm on the Si substrate. An insulating substrate is bonded to the back face of the Si substrate, and at least one separating groove is provided on the Si substrate along the individual boundary lines of the signal-receiving sections PD1, PD2, . . . , and PDm. The separating groove or grooves can reduce the electrical crosstalk between the signal-receiving sections.

[5. Module Having a Plurality of Signal-transmitting Sections and Signal-receiving Sections]

The present invention can also be applied to a complex transceiver module having signal-transmitting sections LD1, LD2, . . . , and LDm and signal-receiving sections PD1, PD2, . . . , and PDm on the Si substrate. An insulating substrate is bonded to the back face of the Si substrate, and a plurality of separating grooves are provided on the Si substrate along the individual boundary lines of the signal-transmitting sections LD1, LD2 , . . . , and LDm and the signal-receiving sections PD1, PD2, . . . , and PDm. The separating grooves can reduce the electrical crosstalk between the signal-transmitting sections, between the signal-receiving sections, and between the signal-transmitting section and the signal-receiving section.

[6. Method for Producing a Tranceiver Module Having a Separating Groove (FIGS. 5 to 8)]

The tranceiver module of the present invention is produced by the following process:

(a) An insulating substrate is bonded to the back face of the Si substrate.

(b) Optical devices for at least one signal-transmitting section and at least one signal-receiving section are mounted on the Si substrate.

(c) Before or after the mounting of the optical devices, a separating groove is provided between the sections to electrically isolate each section from the neighboring section or sections.

As distinct from the production process for an ordinary optical communications module, the foregoing process has additional steps of (a) and (c) described above.

Figure 5:
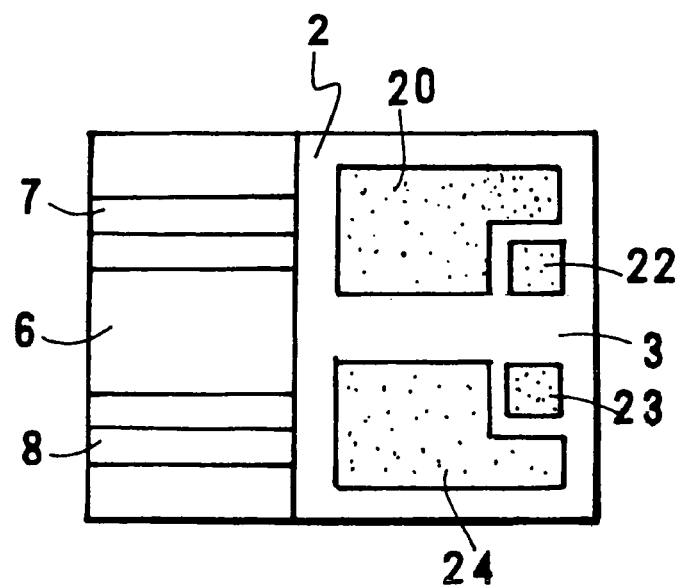
FIG. 5 is a plan view showing one chip worth of Si wafer on which V-shaped grooves and metallized patterns are provided by wafer processing during the process for producing the optical communications module of the present invention having a signal-transmitting section and a signal-receiving section.

FIG. 5 shows the Si substrate 2. Actually, a multitude of the same rectangular segments are formed on a large Si wafer longitudinally and laterally by wafer processing. FIG. 5 shows a chip as one of them. An insulating layer 3 is formed on the rear half of the chip. Metallized patterns 20, 22, 23, and 24 are formed on the insulating layer 3. V-shaped grooves 7 and 8 are formed on the front half 6 of the chip.

The V-shaped grooves 7 and 8 having specified angles of inclination can be formed by anisotropic etching with high precision. The metallized patterns can be formed by first forming a metallic layer by the evaporation or CVD method and then removing unneeded portions by etching. They can also be formed by printing. A multitude of the same segments as shown in FIG. 5 are formed at the same time. Individual segments are severed along the cleavage plane to produce individual chips. Each of them is the Si substrate 2.

Figure 6:
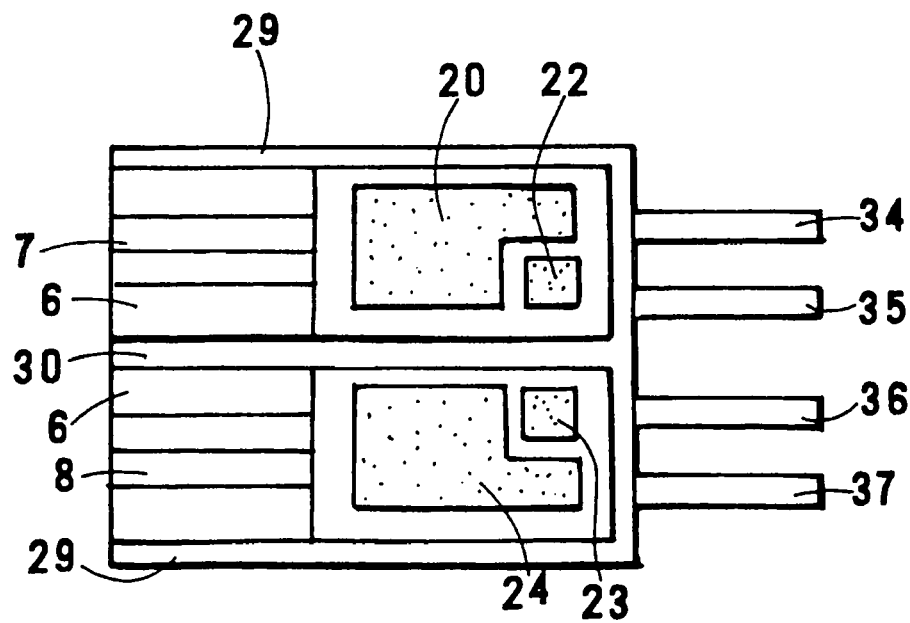
FIG. 6 is a plan view showing the Si substrate chip shown in FIG. 5 after being separated from the rest of the Si wafer and processed by the following steps: (a) an insulating substrate is bonded to the back face of the Si substrate, (b) lead pins are bonded to the insulating substrate, and (c) the Si substrate is separated by a separating groove.

An insulating substrate 29 is bonded to the back face of the Si substrate 2. The insulating substrate may be bonded to the back face of the Si wafer before the formation of the foregoing segments. The insulating substrate is produced by using a material such as a ceramic or plastic material. As shown in FIG. 6, lead pins 34 to 37 are bonded to the insulating substrate 29. A separating groove 30 is formed along the longitudinal bisector of the Si substrate 2. The separating groove 30 reaches the insulating substrate 29 and penetrates into it only slightly. As a result, the Si substrate 2 is separated into the left section and the right section. The two sections look as if they are two islands on the insulating substrate 29. Although FIG. 6 shows the process in which the separating groove 30 is formed before the optical devices are mounted, the separating groove 30 may be formed after the optical devices are mounted.

Figure 7:
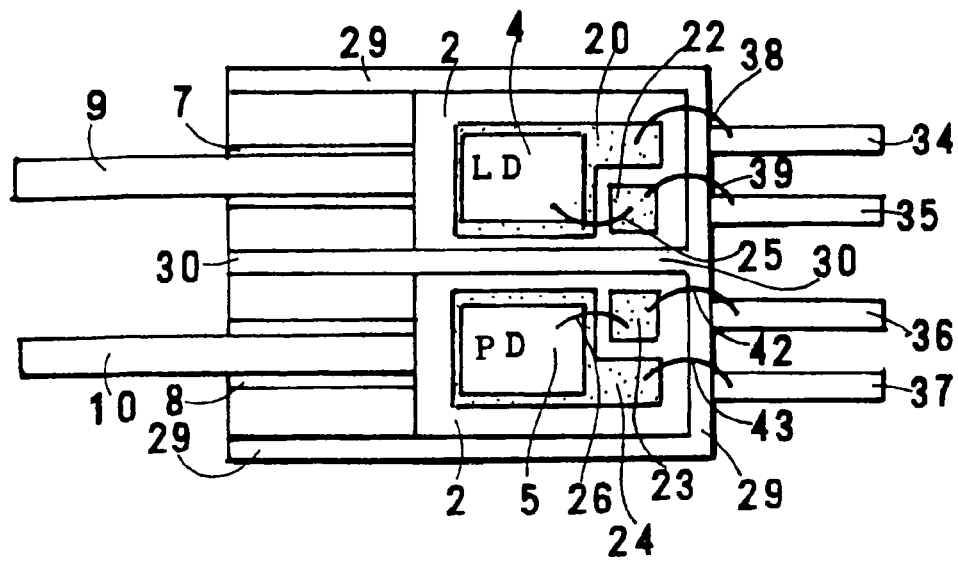
FIG. 7 is a plan view showing the Si substrate in which optical fibers are fixed in the V-shaped grooves, and an LD, a PD, and metallized patterns are connected to lead pins by wire bonding.

As shown in FIG. 7, an LD 4 is bonded onto the metallized pattern 20, and a PD 5 onto the metallized pattern 24. Connections between metallized patterns and between each metallized pattern and the corresponding lead pin are performed by wire-bonding.

Figure 8:
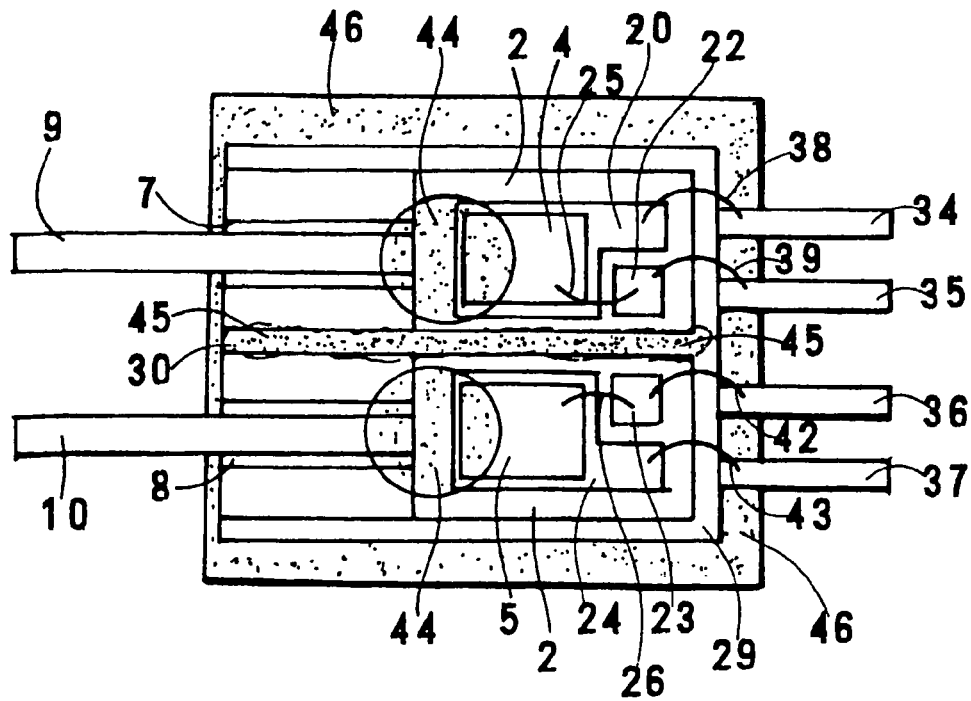
FIG. 8 is a plan view showing the Si substrate in which the spaces between one of the optical fibers and the LD and between the other optical fiber and the PD are filled with a transparent resin, the separating groove is filled with a black resin, and the entire unit is covered with an encapsulating resin.

As shown in FIG. 8, the spaces between the optical fiber 9 and the LD 4 and between the optical fiber 10 and the PD 5 are filled with a transparent resin 44, because light propagates through these spaces. The transparent resin 44 prevents the light from scattering due to reflection and improves the optical coupling between the optical fiber and the optical device. Next, the separating groove 30 is filled with a black resin 45. Thus, a dual-substrate structure of the insulating substrate and Si substrate is formed. The structure is covered with a stiff encapsulating resin 46 such as epoxy resin by transfer molding to form a package-type module. FIG. 8 is a plan view illustrating the configuration of the module viewed from above. Actually, the top surface of the module is covered with the encapsulating resin 46.

EXAMPLE 3

Figure 12:
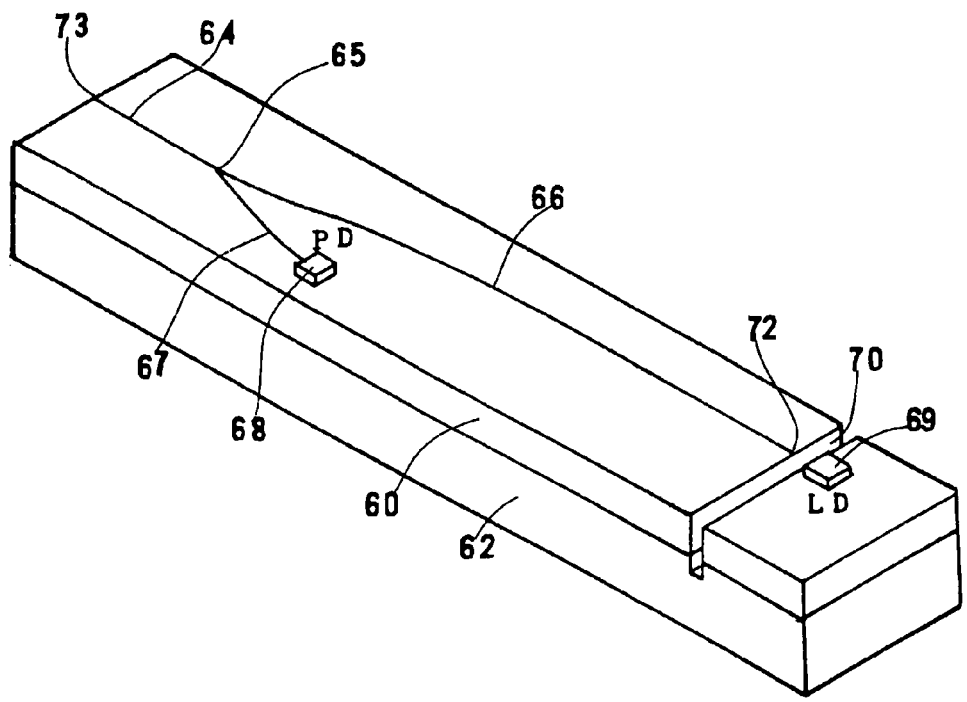
FIG. 12 is a perspective view showing the optical communications module of Example 3 of the present invention.

7. Tranceiver Module Having a Y-branched Optical Waveguide: FIG. 12

As explained above, Example 1 is provided with a signal-transmitting section and a signal-receiving section placed in a left-right configuration, and Example 2 is provided with a signal-transmitting section and a signal-receiving section placed in a front and rear configuration. Even when the two sections are placed in a front and rear configuration, the module is not necessarily limited to the system in which the incoming light is reflected by the WDM filter as explained in Example 2. FIG. 12 shows Example 3 in which a signal-transmitting section (LD) and a signal-receiving section (PD) are placed in a front and rear configuration.

An insulating substrate 62 is bonded to the back face of a slender Si substrate 60. A wave-guiding layer is formed over the Si substrate 60. Optical waveguides 64, 66, and 67 are formed in the shape of the letter Y together with a junction 65 in the wave-guiding layer. In this case, the junction 65 itself has a wavelength-selecting capability. An LD 69 is mounted in the rear portion of the Si substrate 60 such that it faces the end 72 of the optical waveguide 66.

A PD 68 is mounted at the place adjacent to the end of the optical waveguide 67. Although not shown in FIG. 12, metallized patterns are provided at the places for the LD and PD on the Si substrate. The end of the optical fiber from the outside (not shown in FIG. 12) is bonded to the end 73 of the optical waveguide 64. The metallized patterns, LD, and PD are connected to lead pins with wires. The entire unit is molded with a resin. Because these steps are similar to those explained in the foregoing examples, detailed explanations are omitted.

Outgoing light (1.3 μm) emitted from the LD 69 enters the optical waveguide 66 at the end 72, passes through the junction 65, propagates along the optical waveguide 64, and enters the optical fiber (not shown in FIG. 12) at the end 73 to propagate to the outside.

Incoming light (1.55 μm) entering from the outside optical fiber propagates along the optical waveguides 64 and 67, and enters the PD 68 to generate photoelectric current. A separating groove 70 is provided between the end 72 of the optical waveguide 66 and the LD 69. The separating groove 70 suppresses the electrical crosstalk between the LD 69 and the PD 68.

EXAMPLE 4

Figure 13:
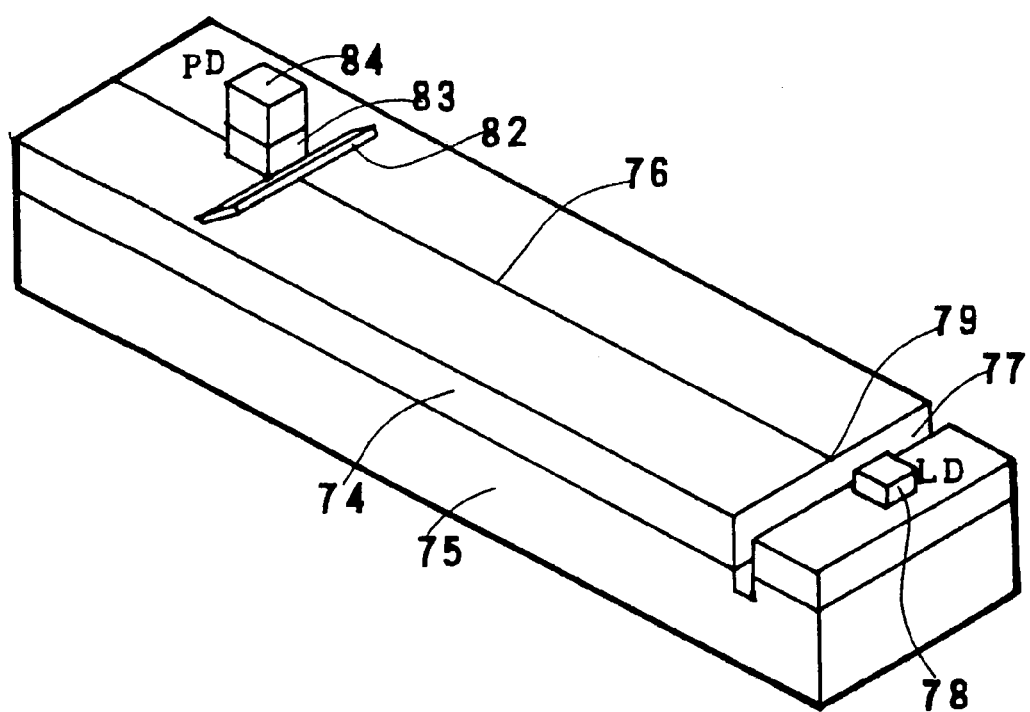
FIG. 13 is a perspective view showing the optical communications module of Example 4 of the present invention.

8. Tranceiver Module: FIG. 13

As explained above, Example 1 is provided with a signal-transmitting section and a signal-receiving section placed in a left-right configuration, Example 2 is provided with a Y-shaped optical path, a WDM filter, and a signal-transmitting section and a signal-receiving section placed in a front and rear configuration, and Example 3 is provided with a Y-shaped optical path and a signal-transmitting section and a signal-receiving section placed in a front and rear configuration. FIG. 13 shows Example 4 in which a signal-transmitting section and a signal-receiving section placed in a front and rear configuration are connected by one optical waveguide.

An insulating substrate 75 is bonded to the back face of a slender Si substrate 74. A wave-guiding layer is formed over the Si substrate 74. One optical waveguide 76 is formed in the wave-guiding layer. A separating groove 77 separating the Si substrate 74 is provided at the end 79 of the optical waveguide 76. An LD 78 constituting the signal-transmitting section is mounted behind the separating groove 77. Outgoing light from the LD 78 passes through the separating groove 77 and enters the optical waveguide 76 at the end 79.

A WDM filter 82 is inserted and fixed at some midpoint in the optical waveguide 76 in an upwardly slanting position. A submount 83 having an optical path within it is fixed immediately in front of the WDM filter 82. A PD 84 constituting the signal-receiving section is mounted on the submount 83. The PD 84 is a rear-illuminated type. The separating groove 77 can prevent the electrical crosstalk between the LD 78 and the PD 84.

What is claimed is:

1. A method for producing an optical communications module, the method comprising the steps of:
   (a) producing an Si wafer on which a multitude of segments to be used as substrate chips for optical communications are provided; each of the segments being provided with:
      (a1) one component selected from the group consisting of at least one V-shaped groove and at least one optical waveguide; and
      (a2) a plurality of metallized patterns formed by one method selected from the group consisting of evaporation, etching, and printing;
   (b) cutting the Si wafer into individual chips to obtain Si substrates for optical communications;
   (c) mounting onto one of the Si substrates one member selected from the group consisting of a pair of a signal-transmitting section and a signal-receiving section, a plurality of signal-transmitting sections, a plurality of signal-receiving sections, and a plurality of pairs of a signal-transmitting section and a signal-receiving section;
   (d) bonding an insulating substrate to the back face of the Si substrate; and
   (e) providing a separating groove that separates the Si substrate along the or each boundary line between the sections constituting the selected member in order to prevent the electrical crosstalk through the Si substrate, the separating groove being provided from the top surface of the Si substrate to some midpoint of the insulating substrate.

2. A method as defined by claim 1, the method further comprising the steps of:
   (a) bonding a plurality of lead pins to the insulating substrate;
   (b) connecting each lead pin to the corresponding signal-transmitting section, signal-receiving section, or metallized pattern;
   (c) fixing at least one optical fiber into the V-shaped groove or grooves; and
   (d) molding the entire unit with a resin.

3. A method for producing an optical communications module, the method comprising the steps of:
   (a) bonding an insulating substrate to the back face of an Si wafer;
   (b) providing on the Si wafer a multitude of segments to be used as chips for optical communications; each of the segments being provided with:
      (b1) one component selected from the group consisting of at least one V-shaped groove and at least one optical waveguide;
      (b2) a plurality of metallized patterns formed by one method selected from the group consisting of evaporation, etching, and printing;
      (b3) one member selected from the group consisting of a pair of a signal-transmitting section and a signal-receiving section, a plurality of signal-transmitting sections, a plurality of signal-receiving sections, and a plurality of pairs of a signal-transmitting section and a signal-receiving section; and
      (b4) a separating groove that separates the Si wafer along the or each boundary line between the sections constituting the selected member in order to prevent electrical crosstalk, the separating groove being provided from the top surface of the Si wafer to some midpoint of the insulating substrate; and
   (c) cutting the Si wafer into individual chips.

4. A method as defined by claim 3, the method further comprising the steps of:
   (a) for performing the following steps, selecting one chip from the chips;
   (b) bonding a plurality of lead pins to the insulating substrate of the chip;
   (c) connecting each lead pin to the corresponding signal-transmitting section, signal-receiving section, or metallized pattern;
   (d) fixing at least one optical fiber into the V-shaped groove or grooves; and
   (e) molding the entire unit with a resin.

5. A method for producing an optical communications module, the method comprising the steps of:
   (a) producing an Si wafer on which a multitude of segments to be used as substrate chips for optical communications are provided; each of the segments being provided with:
      (a1) one component selected from the group consisting of at least one V-shaped groove and at least one optical waveguide;
      (a2) a plurality of metallized patterns formed by one method selected from the group consisting of evaporation, etching, and printing; and
      (a3) a plurality of spaces each of which is to be used for mounting one section selected from the group consisting of a signal-transmitting section and a signal-receiving section;
   (b) cutting the Si wafer into individual chips to obtain Si substrates for optical communications;
   (c) bonding an insulating substrate to the back face of one of the Si substrates;
   (d) providing a separating groove that separates the Si substrate along the or each boundary line between the spaces in order to prevent the electrical crosstalk through the Si substrate, the separating groove being provided from the top surface of the Si substrate to some midpoint of the insulating substrate; and
   (e) mounting in the spaces on the Si substrate one member selected from the group consisting of a pair of a signal-transmitting section and a signal-receiving section, a plurality of signal-transmitting sections, a plurality of signal-receiving sections, and a plurality of pairs of a signal-transmitting section and a signal-receiving section.

6. A method as defined by claim 5, the method further comprising the steps of:
   (a) bonding a plurality of lead pins to the insulating substrate;
   (b) connecting each lead pin to the corresponding signal-transmitting section, signal-receiving section, or metallized pattern;
   (c) fixing at least one optical fiber into the V-shaped groove or grooves; and
   (d) molding the entire unit with a resin.

7. A method for producing an optical communications module, the method comprising the steps of:
   (a) bonding an insulating substrate to the back face of an Si wafer;
   (b) providing on the Si wafer a multitude of segments to be used as chips for optical communications; each of the segments being provided with:

(b1) one component selected from the group consisting of at least one V-shaped groove and at least one optical waveguide;

(b2) a plurality of metallized patterns formed by one method selected from the group consisting of evaporation, etching, and printing;

(b3) a plurality of spaces each of which is to be used for mounting one section selected from the group consisting of a signal-transmitting section and a signal-receiving section; and (b4) a separating groove that separates the Si wafer along the boundary line between the spaces in order to prevent electrical crosstalk, the separating groove being provided from the top surface of the Si wafer to some midpoint of the insulating substrate;

(c) mounting in the spaces of each of the segments one member selected from the group consisting of a pair of a signal-transmitting section and a signal-receiving section, a plurality of signal-transmitting sections, a plurality of signal-receiving sections, and a plurality of pairs of a signal-transmitting section and a signal-receiving section; and (d) cutting the Si wafer into individual chips.

8. A method as defined by claim 7, the method further comprising the steps of:

(a) for performing the following steps, selecting one chip from the chips;

(b) bonding a plurality of lead pins to the insulating substrate of the chip;

(c) connecting each lead pin to the corresponding signal-transmitting section, signal-receiving section, or metallized pattern;

(d) fixing at least one optical fiber into the V-shaped groove or grooves; and (e) molding the entire unit with a resin.

* * * * *